US006813828B2

(12) United States Patent
Dlugokecki et al.

(10) Patent No.: US 6,813,828 B2
(45) Date of Patent: Nov. 9, 2004

(54) METHOD FOR DECONSTRUCTING AN INTEGRATED CIRCUIT PACKAGE USING LAPPING

(75) Inventors: Joseph J. Dlugokecki, Oceanside, CA (US); Gerardo Bagalawig Nazareno, San Diego, CA (US); Carmencita I. Robbins, San Diego, CA (US); Steven David Swendrowski, San Diego, CA (US)

(73) Assignee: Gel Pak L.L.C., Hayward, CA (US)

( * ) Notice: Subject to any disclaimer, the term of this patent is extended or adjusted under 35 U.S.C. 154(b) by 226 days.

(21) Appl. No.: 10/041,717

(22) Filed: Jan. 7, 2002

(65) Prior Publication Data

US 2003/0126741 A1 Jul. 10, 2003

(51) Int. Cl.[7] .............................................. H01R 43/00
(52) U.S. Cl. .................. 29/827; 29/402.01; 29/402.06; 29/827; 29/837; 29/840
(58) Field of Search ......................... 29/825, 832, 833, 29/840, 846, 841, 402.01, 402.03, 402.06

(56) References Cited

U.S. PATENT DOCUMENTS

| 3,482,419 A | 12/1969 | Rogers et al. .................. 65/36 |
| 3,627,901 A | 12/1971 | Happ .......................... 174/52 |
| 3,762,039 A | 10/1973 | Douglass et al. ............. 29/588 |
| 3,969,813 A | 7/1976 | Minetti et al. ................. 29/575 |
| 4,089,704 A | 5/1978 | Heiss, Jr. et al. ............. 134/29 |
| 4,359,360 A | 11/1982 | Harris et al. ................ 156/345 |
| 4,384,917 A | 5/1983 | Wensink ..................... 156/627 |
| 4,474,621 A | 10/1984 | Saccocio et al. ............... 134/1 |
| 4,567,006 A | 1/1986 | Covington et al. ........... 264/22 |
| 5,138,430 A | 8/1992 | Gow, 3rd et al. ............. 357/70 |
| 5,149,662 A | 9/1992 | Eichelberger .................. 437/8 |
| 5,318,926 A | 6/1994 | Dlugokecki ................. 437/210 |
| H1379 H | 12/1994 | Meuer ......................... 451/38 |
| 5,510,273 A | 4/1996 | Quinn ........................... 437/3 |
| 5,589,402 A | 12/1996 | Ramsey et al. ................ 437/2 |
| 5,633,203 A | 5/1997 | Adair .......................... 438/66 |
| 5,700,697 A | 12/1997 | Dlugokecki .................... 437/8 |
| 5,747,385 A | 5/1998 | Torii .......................... 438/690 |
| 5,897,334 A | 4/1999 | Ha et al. ..................... 438/107 |
| 5,919,729 A | 7/1999 | Mori et al. ................... 503/200 |
| 5,930,604 A | 7/1999 | Leonard et al. .............. 438/127 |
| 5,951,813 A | 9/1999 | Warren ....................... 156/305 |
| 5,956,574 A | 9/1999 | Ichikawa et al. ............ 438/106 |
| 5,960,258 A | 9/1999 | Moden ........................ 438/106 |
| 5,972,738 A | 10/1999 | Vongfuangfoo et al. .... 438/124 |
| 6,037,661 A | 3/2000 | Palagonia et al. ........... 257/723 |
| 6,090,644 A | 7/2000 | Moden ........................ 438/127 |
| 6,114,627 A | 9/2000 | Moden ........................ 174/52.4 |
| 6,117,710 A | 9/2000 | Mostafazadeh et al. ..... 438/123 |
| 6,165,813 A | 12/2000 | Quinn et al. .................. 438/67 |
| 6,168,975 B1 | 1/2001 | Zhang et al. ................ 438/111 |
| 6,297,546 B1 | 10/2001 | Moden ........................ 257/669 |
| 6,310,288 B1 | 10/2001 | Moden ........................ 174/52.4 |
| 6,329,212 B1 | 12/2001 | Dobrovolski ................. 438/15 |
| 6,335,208 B1 | 1/2002 | Lowry ........................... 438/4 |

FOREIGN PATENT DOCUMENTS

| JP | 60-124834 | 7/1985 | .......... H01L/21/66 |
| JP | 61-110437 | 5/1986 | .......... H01L/21/56 |
| JP | 62-247553 | 10/1987 | .......... H01L/23/48 |
| JP | 63-184347 | 7/1988 | .......... H01L/21/56 |
| JP | 63-287043 | 11/1988 | .......... H01L/23/28 |
| JP | 2-260548 | 10/1990 | .......... H01L/21/56 |
| JP | 2-278740 | 11/1990 | .......... H01L/21/56 |
| JP | 6-124405 | 5/1994 | .......... G11B/5/09 |
| JP | 6-172196 | 6/1994 | .......... A61K/35/78 |
| WO | WO 92/20096 | 11/1996 | .......... H01L/23/02 |

Primary Examiner—Carl J. Arbes
(74) Attorney, Agent, or Firm—Gray Cary Ware & Freidenrich LLP

(57) ABSTRACT

A method is provided for deconstructing an integrated circuit package comprising: taking an integrated circuit package comprising a lead frame having a plurality of wire bond pads for placing a die into electrical contact with the lead frame, and an encapsulant encapsulating the wire bond pads; and removing the encapsulant to expose the wire bond pads; wherein at least a portion of the encapsulant is removed by a lapping process.

24 Claims, 7 Drawing Sheets

METHOD FOR DECONSTRUCTING AN INTEGRATED CIRCUIT PACKAGE USING LAPPING

FIELD OF THE INVENTION

The instant invention generally relates to the fabrication of packages for integrated circuit devices and more specifically to the deconstruction and reconstruction of encapsulation packages for integrated circuit devices where at least some of the packaging encapsulation material is removed by lapping.

BACKGROUND OF THE INVENTION

The process of designing and producing integrated circuit devices is intensive in both time and human capital, requiring the efforts of highly talented and educated individuals. Upon the design of a new integrated circuit, the first die produced must be tested to verify that it is performing in accordance with the design requirements.

The conventional package design for integrated circuit dies has been a plastic package, comprising a metal lead frame and a polymeric insulating material. As the process of encapsulating a die in molded plastic packages can be automated easily, plastic packages are relatively inexpensive compared to ceramic or hybrid hermetic packages. Plastic encapsulation of dies has thus become a mainstay of the electronics industry.

With a few modifications, the basic assembly process for encapsulation packaging of dies can be used to construct a variety of package types. For example, FIG. 1 illustrates a pin-in-hole package: a dual-in-line package (DIP). FIGS. 2–3 illustrate two surface mount packages: a plastic leaded chip carrier (PLCC) and a quad flatpack (QFP), respectively. Each of these plastic packages is constructed from basic assembly techniques known in the art.

Most currently manufactured integrated circuits are packaged or encapsulated in epoxy using the techniques described above. The integrated circuit packaging industry now resides primarily outside of the United States. Because relatively little domestic investment has been made for development of required tooling and equipment for this process, most necessary equipment is also manufactured outside the United States. Therefore, when a domestic company requires packaging of an integrated circuit die, it typically must pay the price for the offshore service and wait the required time for delivery. Added costs and potentially costly marketing delays are consequently created for chip design companies eager to evaluate newly manufactured prototype devices.

Although package construction from ceramic material is an alternative for packaging an integrated circuit die, ceramic packaging is relatively expensive and consequently is used primarily for high performance applications, such as weaponry. If the die design and intended application permits characterization of device performance in an available substitute package, such as a ceramic package, an alternative packaging method is provided for rapid evaluation of prototype chip designs. In addition to the cost of the alternative packaging, an alternative such as a ceramic package may be a poor substitute for simulating the performance of the die as encapsulated in the manner intended for full-scale production of the device. This is because, depending upon the die's design, the function of the integrated circuit die may be affected by the presence of different encapsulating materials on its surface, and the dimensions of the package conductor paths (leads). If die performance characteristics are sensitive to the encapsulation package, reevaluation and revalidation of the die design may become necessary in the final, production die-package configuration.

Another disadvantage of the use of ceramic packages for prototype units is that the package geometry may necessitate a modification of test sockets and printed circuit boards to receive the prototype ceramic packages for testing and validation of the new die design.

It is thus desirable to be able to test various dies where the dies are encapsulated in the same encapsulant and in a package geometry which allows the various dies to be tested by the same printed circuit boards. A need thus exists for rapid and efficient methods for being able to change dies within a given integrated circuit package and encapsulated by a given encapsulant so that the different dies may be evaluated.

SUMMARY OF THE INVENTION

In one embodiment, a method is provided for deconstructing an integrated circuit package comprising: taking an integrated circuit package comprising a lead frame having a plurality of wire bond pads for placing a die into electrical contact with the lead frame, and an encapsulant encapsulating the wire bond pads; and removing the encapsulant to expose the wire bond pads; wherein at least a portion of the encapsulant is removed by a lapping process.

According to this embodiment, the integrated circuit package may further comprise a die which is in electrical contact with the lead frame via the wire bond pads, the method further comprising removing the die from the integrated circuit package. Optionally, at least a portion of the die may be removed from the integrated circuit package by lapping the die.

Also according to this embodiment, the method may comprise cleaning the wire bond pads by lapping, polishing the wire bond pads by lapping, and/or attaching a die to the exposed wire bond pads. Each of these steps may be performed, at least in part, by lapping.

Also according to this embodiment, the method may comprise encapsulating the die and wire bond pads in an encapsulant, and optionally, altering the shape of the encapsulant encapsulating the die and wire bond pads. Altering the shape of the encapsulant may be performed by lapping the encapsulant.

In another embodiment, a method for deconstructing an integrated circuit package is provided which comprises: taking an integrated circuit package comprising a lead frame having a plurality of wire bond pads for placing a die into electrical contact with the lead frame, and an encapsulant encapsulating the wire bond pads; removing the encapsulant to expose the wire bond pads; and cleaning the wire bond pads; wherein at least one of removing the encapsulant and cleaning the wire bond pads is at least partially performed by a lapping process.

In another embodiment, a method for deconstructing an integrated circuit package is provided which comprises: taking an integrated circuit package comprising a lead frame having a plurality of wire bond pads for placing a die into electrical contact with the lead frame, and an encapsulant encapsulating the wire bond pads; removing the encapsulant to expose the wire bond pads; cleaning the wire bond pads; and polishing the wire bond pads; wherein at least one of removing the encapsulant, cleaning the wire bond pads, and polishing the wire bond pads is at least partially performed by a lapping process.

In another embodiment, a method for deconstructing an integrated circuit package is provided which comprises: taking an integrated circuit package comprising a lead frame having a plurality of wire bond pads for placing a die into electrical contact with the lead frame, a die attached to the wire bond pads, and an encapsulant encapsulating the wire bond pads; removing the encapsulant to expose the wire bond pads; removing the die; and cleaning the wire bond pads; wherein at least one of removing the encapsulant, removing the die, and cleaning the wire bond pads is at least partially performed by a lapping process.

In another embodiment, a method for deconstructing an integrated circuit package is provided which comprises: taking an integrated circuit package comprising a lead frame having a plurality of wire bond pads for placing a die into electrical contact with the lead frame, a die attached to the wire bond pads, and an encapsulant encapsulating the wire bond pads; removing the encapsulant to expose the wire bond pads; removing the die; and cleaning the wire bond pads; attaching a second die to the wire bond pads; and reencapsulating the die; wherein at least one of removing the encapsulant, removing the die, and cleaning the wire bond pads is at least partially performed by a lapping process.

In another embodiment, a method for deconstructing an integrated circuit package is provided which comprises: taking an integrated circuit package comprising a lead frame having a plurality of wire bond pads for placing a die into electrical contact with the lead frame, a first die attached to the wire bond pads, and an encapsulant encapsulating the wire bond pads; removing the encapsulant to expose the wire bond pads; removing the first die; cleaning the wire bond pads; polishing the wire bond pads; attaching a second die to the wire bond pads; and reencapsulating the die; wherein at least one of removing the encapsulant, removing the die, cleaning the wire bond pads, and polishing the wire bond pads is at least partially performed by a lapping process.

In another embodiment, a method for deconstructing an integrated circuit package is provided which comprises: taking integrated circuit packages comprising a lead frame having a plurality of wire bond pads for placing a die into electrical contact with the lead frame, a first die attached to the wire bond pads, and an encapsulant encapsulating the wire bond pads; removing the encapsulants from the integrated circuit packages to expose the wire bond pads; removing the first dies from the integrated circuit packages; attaching second dies to the wire bond pads of the integrated circuit packages; and reencapsulating the second dies; wherein at least one of removing the encapsulants and removing the first dies is at least partially performed by a lapping two or more of the plurality of integrated circuit packages at the same time.

In another embodiment, a method for deconstructing an integrated circuit package is provided which comprises: taking integrated circuit packages comprising a lead frame having a plurality of wire bond pads for placing a die into electrical contact with the lead frame, a first die attached to the wire bond pads, and an encapsulant encapsulating the wire bond pads; removing the encapsulants from the integrated circuit packages to expose the wire bond pads; removing the first dies from the integrated circuit packages; cleaning the wire bond pads of the integrated circuit packages; attaching second dies to the wire bond pads of the integrated circuit packages; and reencapsulating the second dies; wherein at least one of removing the encapsulant, removing the die, and cleaning the wire bond pads is at least partially performed by a lapping two or more of the plurality of integrated circuit packages at the same time.

In another embodiment, a method for deconstructing an integrated circuit package is provided which comprises: taking integrated circuit packages comprising a lead frame having a plurality of wire bond pads for placing a die into electrical contact with the lead frame, a first die attached to the wire bond pads, and an encapsulant encapsulating the wire bond pads; removing the encapsulants from the integrated circuit packages to expose the wire bond pads; removing the first dies from the integrated circuit packages; cleaning the wire bond pads of the integrated circuit packages; polishing the wire bond pads of the integrated circuit packages; attaching second dies to the wire bond pads of the integrated circuit packages; and reencapsulating the second dies; wherein at least one of removing the encapsulant, removing the die, cleaning the wire bond pads, and polishing the wire bond pads is at least partially performed by a lapping two or more of the plurality of integrated circuit packages at the same time.

In another embodiment, a method for reconstructing an integrated circuit package is provided which comprises: attaching a die to exposed wire bond pads of a lead frame so that the die is electrically connected to the lead frame; and encapsulating the die and the wire bond pads in an encapsulant; and reshaping an upper surface of the encapsulant where at least a portion of the encapsulant reshaping is performed by a lapping process.

According to this embodiment, encapsulating the die and the wire bond pads may result in the encapsulant having a convex or concave an upper surface, and reshaping the encapsulant may result in the encapsulant having a planar an upper surface.

Also according to this embodiment, the method may further comprise marking the reshaped upper surface of the encapsulant.

Also according to this embodiment, the reshaped upper surface of the encapsulant is preferably sufficiently flat to permit labeling by printing, photolithographic or mechanical marking techniques to simulate a production transfer molded encapsulated chip package, the method further comprising marking the reshaped upper surface of the encapsulant.

According to any of the above embodiments, lapping may be performed by any lapping technique. For example, lapping may be performed by an abrasive or ablative lapping process. Lapping may be performed by a mechanical, chemical, or electromagnetic lapping process. In one variation, lapping is performed using a laser or another source of electromagnetic radiation. In another variation, lapping is performed using a planar abrasive surface. In another variation, lapping is performed using a planar abrasive surface attached to a wheel or belt. In another variation, lapping is performed using a planar abrasive surface that is sufficiently large to permit more than one package to be lapped at the same time. In another variation, lapping is performed by chemical etching. In another variation, lapping is performed using a gas-jet or liquid-jet containing a particulate material. In another variation, lapping is performed via a mechanical grind. In another variation, lapping is performed using a combination of mechanical and chemical ablation. In another variation, lapping is performed using a combination of mechanical and electromagnetic ablation. In another variation, lapping is performed using laser ablation. In another variation, lapping is performed using a combination of electromagnetic and chemical ablation. In another variation, lapping is performed by impinging an ultra-fine particulate using a high pressure gas-jet against the material to be lapped. In another variation, lapping is performed by impinging an ultra-fine particulate under high pressure against the material to be lapped. In another variation, lapping is performed by delivering a pulsating liquid-jet under high pressure against the material to be lapped. In another variation, lapping is performed by plasma etching. In another variation, lapping is performed by a pressurized liquid against the material to be lapped.

Also according to any of the above embodiments, cleaning of the exposed wire bond pads may be performed by liquid impingement upon the surface of the wire bond pads and/or by the use of ultrasound. For example, de-ionized water may be delivered using a high pressure pulsating liquid ejector device. The de-ionized water may then be removed by delivering electronic grade alcohol using a high pressure pulsating liquid ejector device. Cleaning the wire bond pads may also comprise the use of ultrasound in combination with de-ionized water and/or alcohol.

DETAILED DESCRIPTION OF THE INVENTION

Figure 1:
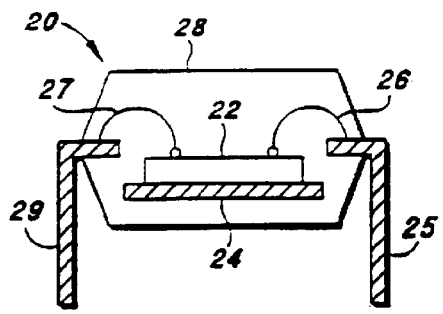
FIG. 1 shows a cross-sectional view of a plastic dual-in-line package (DIP).

The present invention relates to various methods for deconstructing an integrated circuit package (hereinafter "IC package") which comprise using lapping to remove an encapsulant covering an integrated circuit chip (hereinafter a "chip" or "die") in the IC package.

The present invention also relates to various methods for reconstructing an IC package which comprise using lapping to shape an encapsulant which is used to encapsulate a die which is mounted within the reconstructed IC package.

In one embodiment, the present invention relates to packaging a die within an IC package by modifying a previously fabricated IC package. According to the embodiment, encapsulating material is removed from the IC package, at least in part by lapping. This serves to expose wire bond pads of a lead frame within the IC package. A mounting surface is formed over or near a die attach pad and wire bond pads of the lead frame. A new die is then mounted within the IC package and electrically connected to the exposed wire bond pads. An encapsulant is then added to encapsulate the die and exposed wire bond pads. The shape of the encapsulant of the resulting IC package may optionally be modified by lapping. For example, the surface of the encapsulant, which will frequently have either a convex or concave shape, can be made planar by lapping. Afterward, the surface may then be marked. If desired, the shape and/or labeling of the encapsulant may be made to replicate the previously fabricated IC package.

It is noted that in some instances, the IC package to be deconstructed may be a "dummy" package in the sense that the package contains a die that has no functional electronic capacity. Dummy packages are produced and sold routinely and inexpensively, typically for the purpose of setup adjustment of automatic handling equipment for electrical testers and printed circuit board soldering equipment. The present invention is intended to encompass the processing of dummy packages.

One advantage of using lapping to remove the encapsulant of an IC package is that lapping can be employed both for the gross removal of encapsulant and for the precise removal of encapsulant where it is necessary to avoid damaging silver, gold or other plating of wire bond pads Removal of the encapsulant by lapping may be used to accomplish several different aspects of deconstructing an integrated circuit package. For example, lapping may be used to remove all or a portion of the encapsulant. It is noted that a portion of the encapsulant may be removed by methods other than lapping without departing from the present invention.

Lapping may also be used to remove all or a portion of a die which is present in the IC package. Since it is typically unnecessary to recover the die present in the IC package, it is possible to destroy and remove the die by lapping the die away.

Lapping may also be used to expose wire bond pads of a lead frame of the IC package where the die makes electrical contact with the package, typically through the use of small wires that are bonded between the wire bond pads and corresponding contact pads of the die. Advantageously, material can be removed with precision by lapping, thereby allowing encapsulant removal and wire bond pad exposure without damaging the plating material on the lead frame.

Lapping may also be employed to polish and clean the wire bond pad surfaces. Previously, a separate non-lapping cleaning step was needed in order to obtain a micro-smooth cleaned wire bond pad surface. Advantageously, lapping can be used to achieve a smoothness to electrical contacts that is less resistive and more durable than alternative cleaning methods.

Lapping may also be used to form a flat mounting surface over the die mounting area (typically referred to as the "die attach pad") for mounting a new die. Lapping is well designed for creating such a flat mounting surface. Once removed, electrical connection may be made between contact pads of a new die and the exposed wire bond pads of the lead frame. The IC package may then be reconstructed, e.g., by introducing a new die and applying an encapsulant to encapsulate the new die.

As can be seen, a feature of using lapping is that it can be effectively used throughout the entire process of removing an encapsulant and preparing an IC package for receipt of a new die.

The present invention also relates to methods for reconstructing an IC package with a new die which comprise using lapping to shape an encapsulant which is positioned over the new die that has been placed in the IC package. Once the encapsulant has been reshaped, for example to replicate the shape of the encapsulant of the original IC package, the encapsulant may be marked so that the resulting package replicates the initial die package. Flattening the encapsulant by lapping can serve to improve the ability of the package to be marked.

Alone or in combination, the above uses for lapping may be employed to re-configure an IC package (with or without an installed die) to include a new die installed and interconnected for normal use in the IC package.

Lapping generally involves the removal of planar incremental sheets or layers, progressing in a direction perpendicular to an actual or hypothetical planar surface that lies in a plane that transects the object being lapped, in this case an encapsulation packaged die. Lapping, as the term is used herein, is intended to cover all forms of lapping for the removal of material. Several different types of lapping exist, including abrasive and ablative forms of lapping. Examples of abrasive forms of lapping include, but are not limited to, mechanical abrasion (such as micro-milling), chemical abrasion, and particle abrasion (such as gas-jet microabrasive-particulate ("sand blasting") or liquid-jet microabrasive-particulate impingement or plasma etching). Examples of ablative forms of lapping include, but are not limited to, chemical, thermal and electromagnetic lapping (e.g., laser ablation, which comprises delivering appropriately oriented electromagnetic radiation, having an interactive wavelength for the material to be ablated.).

Those of skill in the art will appreciate that various other abrasive or ablative lapping techniques may exist or may later be developed. All types may be used in the present invention.

When removing an encapsulation material by lapping, it may be desirable to employ a continuous lapping process which is stopped or slowed by the occurrence of an event, such as the approach of the lapped encapsulant surface to a specified distance from an actual or hypothetical surface. For example, the surface to be exposed may be a wire bond pad surface of the lead frame, where it is desirable to slow or stop the lapping process before exposing the wire bond pad surfaces of the lead frame. This may be done by reducing the lapping speed, either manually, or preferably by an automated sensor, when the lapped surface is a certain distance, for example 500 microns ($\mu$m) from the top of the die. Then, for the remaining material to be removed, slower lapping may be performed. When the plane of the surface to be exposed is reached, lapping may be stopped, again preferably by an automated sensor.

The speed at which lapping is performed is generally related to the type of material and type of lapping that is being performed. It is possible to control the speed of lapping by controlling the operation of the lapping device (e.g., by controlling the rotations per minute and type of abrasive for a lapping wheel, or linear speed and nature of abrasive for a belt type abrasive lapping device). However, given that the thicknesses being lapping in the present invention are small, it is generally preferred to have manual and/or automated sensing for the progress of lapping in order to insure that too much material is not removed.

Where possible, particularly in the case of electromagnetic ablative lapping techniques and chemical ablative lapping techniques, it is desirable to employ a technique which can selectively remove the encapsulant over other materials used in the IC package.

In general, lapping has many design features which make it advantageous for use in the methods of the present invention. For example, lapping is well suited to form flat and uniform surfaces. Lapping facilitates formation of a flat and uniform surface for the die attach pad.

Lapping can be used to perform both gross and precise removal of material and is well suited for performing both gross and precision encapsulant removal. The ability to combine gross and precision encapsulant removal povides both cost and time saving.

Lapping permits simultaneous formation of a flat die mounting area (die attach pad) with encapsulant removal to expose and wire bond pad surfaces.

Lapping can be used to micro-polish and clean exposed surfaces such as wire bond pads. Micro-polishing and cleaning of exposed wire bond pad surfaces can be advantageously performed on the same lapping apparatus used for removing the encapsulating material. Micropolished surfaces generated by lapping provide contact junctions that have lower resistance and greater ability to withstand interfacial surface rearrangements, oxidation and other reactions that can increase contact resistance over time, thus impacting packaged chip device life.

Lapping can also be used to tool multiple IC packages in parallel (simultaneously or quasi-simultaneously, depending on the specific type of lapping employed). Simultaneous or quasi-simultaneous tooling permits completion of a batch of IC packages at one time in about the same time period as for one IC package, providing both cost and time saving.

Lapping also allows IC packages to be reconstructed so that they fit into the same printed circuit as the original package. As a result, the reconstructed IC package can be made to have the appearance of a production rather than a makeshift part. Furthermore, the flat surface and uniformity of print and printed character attributes obtainable by labeling a lapped encapsulant surface facilitates identification and handling of the chip packages by automated equipment.

The formation of a flat surface after encapsulation of a newly installed die by lapping the encapsulation material also facilitates the ability to mark or label the reconstructed IC package. Once complete, the reconstructed IC package can be made to take on the appearance of the original IC package or at a minimum, a full-production encapsulated die package, in both geometric aspect and labeling.

1. Layout of Typical IC Packages

Figure 2:
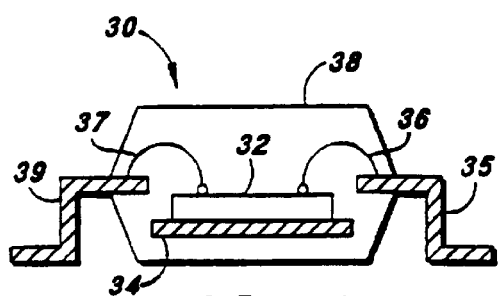
FIG. 2 shows a cross-sectional view of a plastic quad flatpack (QFP).
Figure 3:
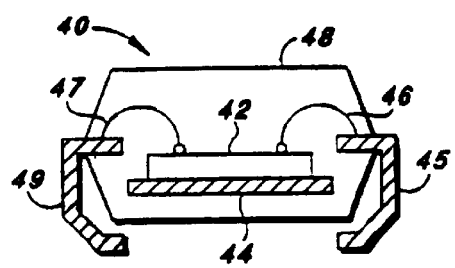
FIG. 3 shows a cross-sectional view of a plastic leaded chip carrier (LCC).

FIGS. 1–3 illustrate the fabrication and layout of typical IC packages. FIGS. 1–3 show, respectively, a dual-in-line package (DIP) 20, a quad flatpack (QFP) 30, and a plastic leaded chip carrier (PLCC) 40. FIGS. 1–3 illustrate but three examples of IC packages, among the many IC packages known in the art, which may be modified by the methods of the instant invention. Other IC packages that may be modified using the methods of the present invention include, but are not limited to, single-in-line packages (SIPs), zigzag-in-line packages (ZIPs), quad-in-line packages (QUIPs), small outline (SO) packages, fine-pitch quad flatpacks (FQFPs), pin grid arrays (PGAs), etc. For further descriptions of the various IC package families and their characteristics, see for example, *Electronic Packaging and Interconnection Handbook*, Charles A. Harper, 1991, pp. 6.41–6.49, which is incorporated herein by reference. It should be understood that the IC packages shown in FIGS. 1–3 are presented for illustration purposes only, and that the invention can be extended to all pre-fabricated IC packages.

The IC packages shown in FIGS. 1–3 illustrate the similarities in construction in IC packages. Each package (20, 30 and 40) has, respectively, a die (22, 32 and 42) mounted onto a die attach pad (24, 34 and 44), a lead frame (25, 35 and 45), and a set of wire bonds (26, 36 and 46). Each lead frame contains a plurality of leads or fingers (not shown) for interconnection to a plurality of contact pads (also not shown) on each die via the respective set of wire bonds. Each package (20, 30 and 40) includes encapsulation material (defined by outline 28, 38 and 48, respectively). Each lead further has a plurality of wire bond pads (27, 37, 47) and legs (29, 39, 49) which extend from the encapsulated portion (28, 38, 48) of the package, respectively.

The fabrication of an IC package will now be described in relation to FIG. 1. The fabrication of the IC package 20 begins with a metal lead frame 25 that is either stamped or chemically etched. The choice of lead frame material depends on die attach methods, reliability, thermal requirements, and mounting requirements (through-hole or surface mount). The lead frame 25 is commonly comprised of copper, KOVAR®, nickel, alloy 42, or aluminum.

The two most commonly used lead frame materials are metal alloy 42 and copper, but wire bonds do not readily adhere to these bare materials. Thus, to provide for a consistent and reliable wire bond attachment, it is important to plate the wire bonding surfaces (i.e., the tips of the fingers nearest the die, also referred to herein as "wire bond pads") when preparing the lead frame prior to attachment of the die. The wire bond pads are therefore usually plated with silver, gold or another conductive metal to which the wire bonds adhere sufficiently. The leads extending from the resulting package can then be soldered directly to a printed circuit board.

Once a die 22 has been cut ("diced") from a wafer (not shown), the die 22 is attached to the center pad 24 of the lead frame 25, herein referred to as the "die attach pad" 24. Attachment may be made by using a gold-silicon eutectic or a polymer adhesive, such as epoxy or polyamide. Following die attachment, each of a plurality of contact pads (not shown) on the die 22 are interconnected to a respective one of a plurality of wire bond pads 27 on the lead frame 25 by wire bonds 26. The wire bonding process can be accomplished in a variety of ways, for example, by ultrasonic vibration pressure, by thermocompression bonding, or by a combination of both methods (termed thermosonic bonding).

After the wire bonds 26 have been attached, the die 22 and wire bonds 26 are encapsulated in an encapsulant 28. The encapsulant serves as a dielectric insulator and shields against environmental degradation. Once the integrated circuit die 22 and the wire bonds 26 are encapsulated within the encapsulant 28, the legs 29 of the lead frame 25 remain exposed extending from the body of the package. This encapsulation process provides an electrical connection from the contact pads on the die to the outside world and provides excellent protection to the die and the wires.

A wide variety of materials have been used as encapsulating material for IC packages. It is noted that the present invention is not limited in regard to a particular type of encapsulating material. Rather, any material which is used as an encapsulating material for an IC package may be manipulated by lapping according to the present invention.

Examples of properties which are generally desirable for encapsulating materials include high purity (particularly with respect to ionic and undesired conductive contaminants); excellent adhesion to other packaging materials (such as mono- or poly-crystalline Si, passivation layers and surface modifications thereof, lead frame, etc.); poor adhesion to mold surfaces; impermeability to moisture and low moisture absorption; sufficient rigidity to protect the die; low coefficient of thermal expansion (CTE); low elastic modulus; heat resistance sufficient to withstand soldering operations; ease of processing; and low cost.

Encapsulating materials that have been used in IC packages include polymeric materials, such as plastic and epoxy. The encapsulation process for fabricating plastic packages is known as transfer molding. A complete description of transfer molding and the fabrication of plastic packages for dies and electronic components in general may be found, for example, in *Packaging—Electronic Materials Handbook,* 1989, Vol. 1, pp. 470–480, published by ASM International, which is incorporated herein by reference.

Epoxies are often useful as encapsulant materials due to a combination of factors including low cure shrinkage, rapid cure, a polar nature, and capability for blending with a wide variety of modifiers to impart desired mechanical properties. Epoxy monomers and prepolymers are commercially available in a wide variety of viscosities, and consequently may be easily tailored to meet a particular molding requirement. Other thermosetting polymers, such as silicones and unsaturated polyesters, are less commonly employed. The primary use of silicone polymers is in high-temperature applications (in the range of 200° C.) that warrant their higher cost. Advantages of unsaturated polyester resins include: extremely fast cure kinetics; the cure reaction does not generate any by-products; and low cost. However, cured unsaturated resins also have inferior strength and environmental resistance compared to epoxies and silicones.

2. Deconstructing an IC Package

The deconstruction of an IC package will now be described in regard to FIGS. 4–6 which illustrate a prefabricated plastic leadless chip carrier (LCC) and FIG. 7A which illustrates a flow diagram for deconstructing the package. While the following discussion involves a leadless chip carrier, it should be understood that any of the IC packages known in the art may be modified and deconstructed according to the methods of the present invention.

Figure 4:
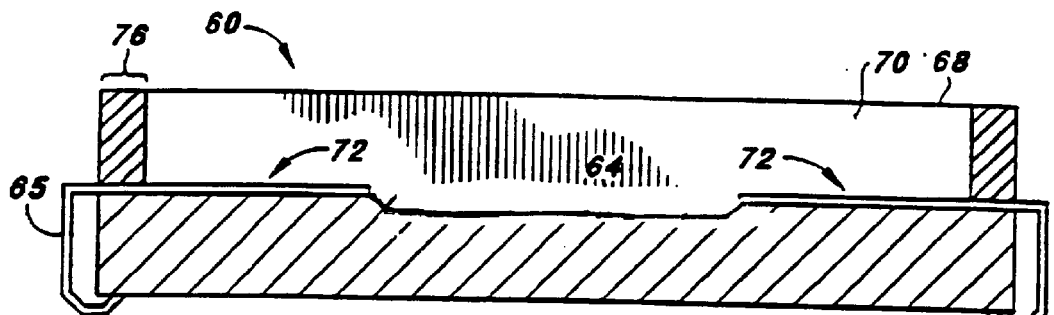
FIG. 4 shows a cross-sectional view of a plastic leaded chip (LCC) carrier modified in accordance with the present invention and illustrating an area which is removed to expose the lead frame.
Figure 5:
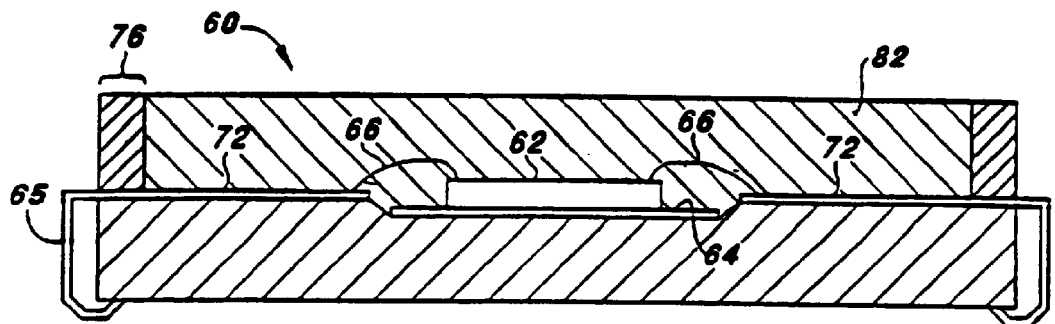
FIG. 5 shows a cross-sectional view of the LLC shown in FIG. 4 after reconstruction.
Figure 6:
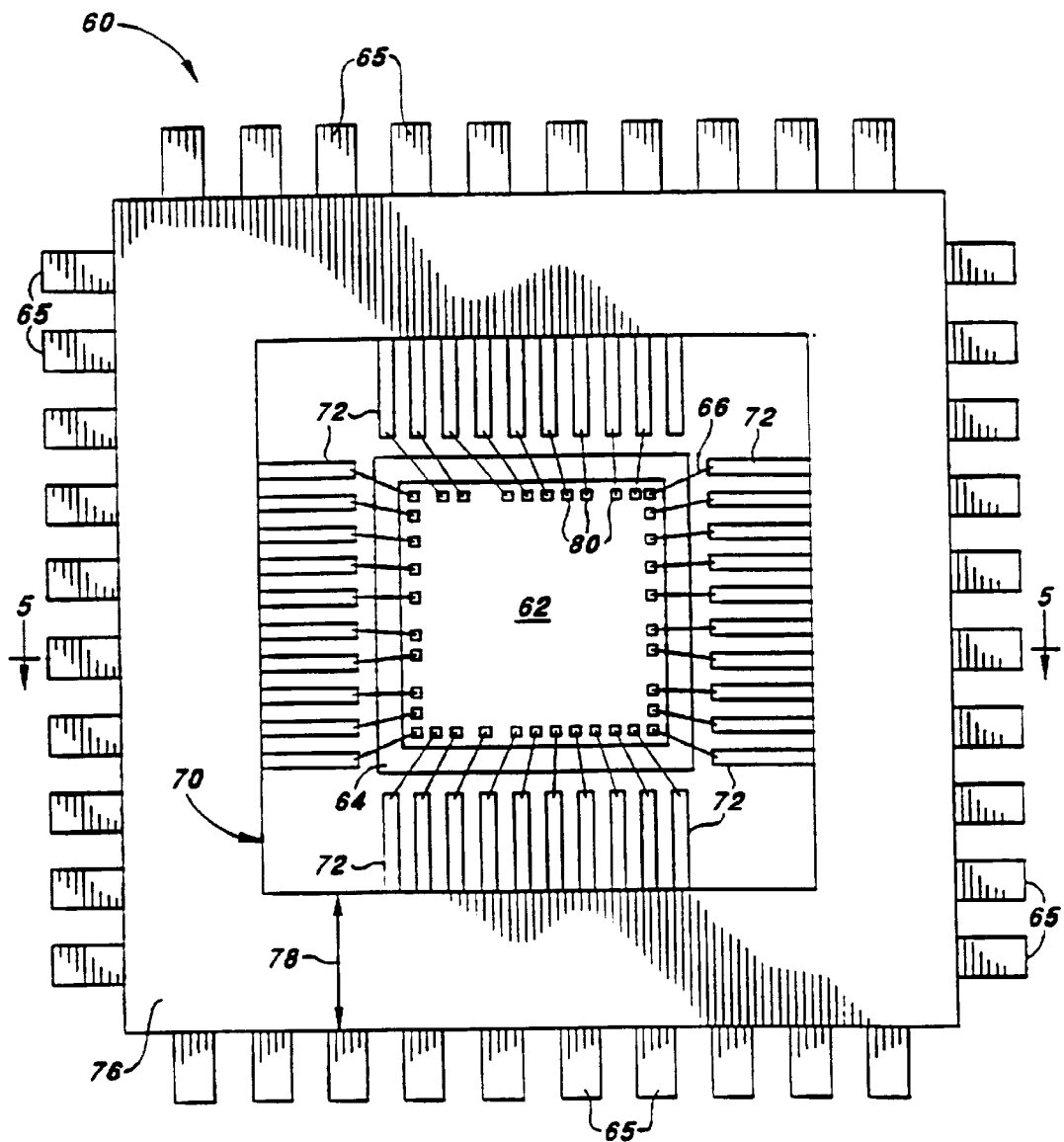
FIG. 6 shows a plan view of an integrated circuit chip (die) mounted onto the die attach pad of the plastic leaded chip carrier shown in FIGS. 4 and 5.

FIGS. 4 and 5 show a cross-sectional view of a prefabricated leadless chip carrier (LCC) 60 before and after die attachment, respectively, taken across the lines 5—5 shown in FIG. 6. FIG. 6 shows a plan view of the leadless chip carrier shown in FIG. 5.

As seen in FIG. 4, a leadless chip carrier 60 is shown to have a die attach pad 64 and a lead frame 65. The original outer dimension of the package is indicted by outline 68. Encapsulant material is placed so as to occupy a volume 70, which overlies the die attach pad 64 and a portion of the lead frame 72 (i.e., wire bond pads 72).

As shown in FIGS. 5 and 6, a chip 62 is mounted onto the die attach pad 64 and a plurality of wire bonds 66 are used to connect the plurality of input/output pads 80 on die 62 to a respective one of the wire bond pads 72 on the lead frame 65. The volume 70 (FIG. 4) is then filled with an encapsulant 82. Optionally, a lateral retaining wall or dam 76 may be deployed on all four sides of the package 60 (shown in FIG. 6) to laterally support the encapsulant 82, thereby preventing lateral spreading of the encapsulant. When such a lateral encapsulant retaining wall is employed to help define the shape of the reconstructed IC package, the width 78 of the wall 76 is preferably at least wide enough to allow for exposure of the wire bond pads 72 on the lead frame 65, and function to provide sufficient support to hold the encapsulant 82 when the encapsulant is formed or added. It is noted that the embodiment of the invention depicted in FIG. 8 prior to lapping to form or reconstitute repackaged geometry), does not employ a lateral wall. However, the package should expose the wire bond pads 72 on the lead frame 65.

A process for removing encapsulant by lapping will now be described with reference to FIG. 7A. It is to be emphasized that the process depicted in FIG. 7A is not intended to be limiting in the sense that not all of the steps must be carried out and the steps need not necessarily be carried out in the sequence shown. For example, the process shown in FIG. 7A refers to gross material removal (Block 96) followed by precision material removal (Block 104). However, gross and precision material removal may be carried out in a single step using any of the lapping techniques, or equivalent techniques, described for the gross or precision material removal.

Figure 7A:
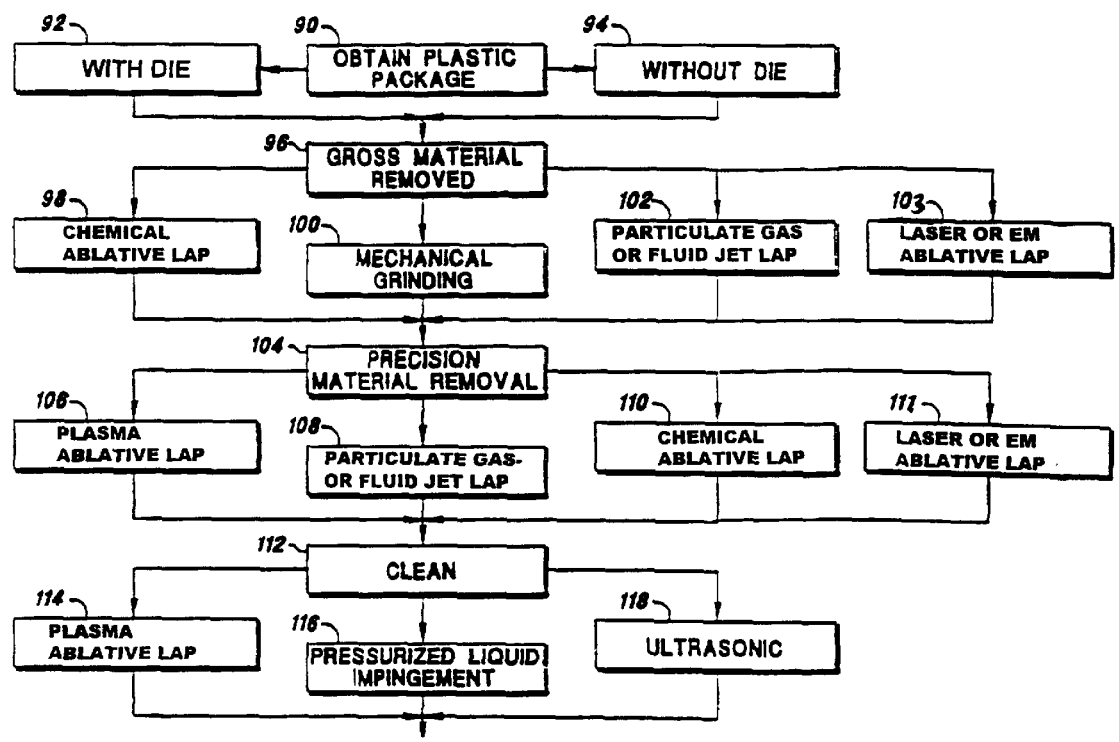
FIG. 7A illustrates process steps which may be used to deconstruct an IC package.

With reference to FIG. 7A, Block 90 comprises the step of obtaining (either by fabricating or by procuring) an IC package to be deconstructed. As indicated in Blocks 92 and 94, it does not matter if the IC package contains a dummy die inside because the removal process will also remove or disable any existing die and wire bonds, preferably during lapping for encapsulant removal to expose the wire bond pad surface.

In Block 96, lapping of the encapsulant from the IC package is performed. The silver, gold or other plating of the lead wires is preferably not removed by the lapping so that a new die and the wire bonds may be attached. This can be accomplished by clearing away a majority of the encapsulant using a lapping technique.

In one variation, a lapping wheel or belt having a large enough lapping surface to simultaneously lap encapsulant from multiple encapsulation packages is used. These IC packages may be mounted on a single vacuum release chuck or the like. Other lapping processes may also be used which permit multiple IC or dummy encapsulation packages to be lapped simultaneously or quasi-simultaneously.

When removing encapsulant, the lapping process is preferably slowed at some distance the surface of the wire bond pads. For example, lapping may be slowed at 200 $\mu$m to 500 $\mu$m from the surface of the wire bond pads of the lead frame, and the lapping rate is decreased to permit finer control, such rate reduction being the onset of the precision removal step, Block 104. If adequate control of the lapping process can be obtained without reducing its rate, then such rate reduction is not required. Preferably such rate reduction is effected automatically by use of a sensor actuated switching system, the sensor being optical, mechanical, acoustic, electronic or any equivalently functioning sensor, but this lapping rate reduction can be manual. The material removal lapping process is stopped, again preferably automatically, but alternatively manually, when the surface of the wire bond pads of the lead frame is exposed. Automation may be obtained by known mechanisms, for example, by sensors in communication with digital logic circuits that control servo motors.

After lapping for material removal, further lapping may be performed to micro-polish the surface of the wire bond pads without removing the plating thereon. Micro-polishing of surfaces reduces surface rearrangements and reactions such as oxidation, and surface potential fluctuations that increase electrical resistivity (decrease conductivity) at the wire bond pad/wire bond interface. Thus, micro-polishing of the wire bond pad surfaces advantageously obtains a better electrical contact that is more resistant to degradation over time. Lapping techniques described herein which employ mechanical abrasives, for example planar belt or wheel lapping devices and particulate gas- or liquid-jet lapping, can obtain micro-polishing of the wire bond surfaces by use of an ultra-fine particulate. Analogously, a polishing lap by electromagnetic radiation such as by laser may be obtained by reducing the radiation intensity, e.g. reducing the number of photons per unit time.

In many cases, although the material removal lapping is complete and stopped, the lapping apparatus can switch over to a micro-polishing lap without disassembly of the setup and removing the object (typically vacuum release chuck holding multiple chip encapsulation packages) followed by reassembly for polishing. For example, in a planar wheel or belt lapping device that employs a continuous influx/efflux of a lapping oil containing a particulate, particulate size can be reduced to a size effecting micro-polishing, or a laser lapping device can be switched to lower intensity. Again, the switch to micro-polishing mode is preferably automated by use of conventional sensor actuator technology, but may also be manual. Those of skill in the art will appreciate that changes in particulate diameter or electromagnetic intensity need not be in large steps, but may be gradual, for example gradual reduction of intensity or particle size.

It is noted that cleaning and/or micro-polishing may optionally be performed by various known non-lapping methods, such as abrasive free fluid or gas jet impingement and the like.

It is contemplated that lapping may also be used to remove a die in the IC package, either completely or partially. Lapping may be continued until the die is removed from the die attach pad and the wire bond pad surfaces are exposed.

Alternatively, the gross material removal step may simply lap away the encapsulation material over and around the periphery of the die in the IC package. Then, the die may be popped out or pried off of its die attach pad using conventional mechanical/thermal techniques. The wire bond pad surfaces may then be exposed, optionally by lapping.

After the die is removed, further lapping may be performed to expose the wire bond pad surfaces and/or to micro-polish those surfaces. Alternatively other methods of precision material removal and micro-polishing, such as burrowing particulate gas- (e.g. burrowing sand blasting) or liquid-jet impingement may be employed as described in U.S. Pat. No. 5,700,697 to Dlugokecki.

In embodiments that do not employ lapping for precision removal of encapsulation material, gross material removal may be stopped 2 to 5 mils above the wire bond pad surface, forming the die attachment surface slightly above the plane containing the wire bond surfaces. Exposure of the wire bond pads of the lead frame by a burrowing fine encapsulation material removal technique permits the wire bonds to pass through the tunnels or burrows to make contact with the wire bond pads.

Currently known or obtainable process options, as defined by this invention, for removal of the encapsulant material include any burrowing or lapping technique that employs mechanical, chemical, electrical or electromagnetic ablation, and may include chemical (Block 98), mechanical grind (Block 100), and particulate gas- or fluid-jet (Block 102), and laser or electromagnetic (Block 103) processes.

Block 104 comprises the steps of precision material removal, which is preferably by lapping. As has been described above, this can be achieved using plasma ablative lapping (Block 106), particulate gas- or fluid-jet (sand blasting) (Block 108), chemical ablative lapping (Block 110) or, laser or electromagnetic ablative lapping (Block 111). Block 104 is depicted separately from precision material removal. This is for schematic purposes only, and should not be interpreted to signify separate steps are required.

In an alternative embodiment, a particulate gas- or liquid-jet (sand blasting) technique may be used to expose and polish the wire bond surfaces, i.e., a jet of particulate containing gas and/or liquid and/or paste impingement under high pressure, as described below for cleaning techniques. In one embodiment, the final several mils of material are removed using a precision, hand held sand blaster under a magnifying glass. A very fine sodium bicarbonate may be used as the sand blast media (particulate gas-jet). Alternatively, a liquid or liquid paste may be used as the sand blast media (particulate liquid-jet). This sand blasting process can be used to remove the encapsulant at a much faster rate than it will the silver, gold or other plating material (typically metallic). This allows the encapsulant to be removed without causing significant damage to the plating material. An even finer particulate, for example an ultra-fine sodium bicarbonate particulate, wherein ultra-fine denotes having a mean diameter of less than about 15% (0.15), may be used to micro-polish the wire pad surfaces.

Whether precision encapsulant removal is performed by a lapping or burrowing technique, and whether or not a micro-polishing step is employed, residual abrasive particulate material and carrier, such as lapping oil, and, depending upon the exact process, loose particulate encapsulant and/or wire bond/wire bond pad and/or die material dust is preferably cleaned from the wire bond pad surface prior to contacting the wire bonds to the wire bond pads. This is the cleaning step (Block 112) for removing the residual abrasive particulate material in preparation for mounting a new die. Cleaning can be achieved using a variety of methods including a plasma ablative lap (Block 114), a pressurized liquid impingement (Block 116), or ultrasonic cleaning (Block 118). In a preferred embodiment, cleaning is accomplished using deionized water which is delivered to the surface of the sand blasted areas using a high pressure pulsating liquid ejector device such as that used for cleaning between teeth (a water pick). To remove the water, the water pick washing step is repeated using electronic grade alcohol. Alternatively, ultrasonic cleaning in deionized water and alcohol and/or plasma etching may be employed in place of the high pressure liquid impingement cleaning step.

The skilled artisan will appreciate that the cleaning step may be reduced but not completely eliminated when a lapping technique is employed for encapsulant removal followed by a micro-polishing lapp. As described above, the planar layer increment removed per unit time by the lapping method employed may be decreased for the final incremental lapping cycles to such a small dimension as to effect a micro-polishing of the plated wire bond pad surfaces. This may be obtained without substantial removal of the gold, silver or other plating material as to affect the conductive properties of the lead pad surfaces. Indeed, as has been mentioned herein, such micro-polishing is known to remove surface imperfections that are susceptible to surface reorganization and oxidation, and is therefore contemplated as a preferred embodiment of the invention. As has been noted, micro-polishing can be effected on a lapping apparatus after both gross and precision material removal without disassembly of the tooling setup. The combined process can be wholly automated to yield a superior wire bond pad to wire bond electrical junction and suitable die attach surface in, effectively, a single tooling step.

3. Reconstructing an IC Package

Another aspect of the present invention relates to the reconstruction of an IC package by the attachment of a new die, encapsulation of the new die, and the use of lapping to shape the encapsulant to a desired or required form.

When replacing an original die with a new die in an IC package, it is frequently desirable to have the reconstructed IC package have the same size, geometry, appearance and aesthetics as the original IC package. For example, it is desirable that the reconstructed IC package be compatible with printed circuits designed for the original IC package. Reconstructed IC packages prepared according to the invention, because the encapsulant can be reshaped, are able to require the same or reduced space as the original package and take the appearance of a production part rather than a makeshift part. Furthermore, a smaller IC package may be formed than the original which can fit into a smaller space than reconstructed packages that are not lapped.

The formation of a flat surface by lapping the encapsulation material also facilitates the ability to mark or label the reconstructed IC package, for example by printing and photolithography. Such labeling may be for identification and/or advertisement. Also, the flat surface and uniformity of print and printed character attributes obtainable for labeling the post reconstruction lapped encapsulant surface facilitates identification and handling of the chip packages by automated equipment.

The introduction of a new die, encapsulation of the new die, and the use of lapping to reshape the encapsulant will now be described in relation to FIGS. 7B and 8.

Figure 7B:
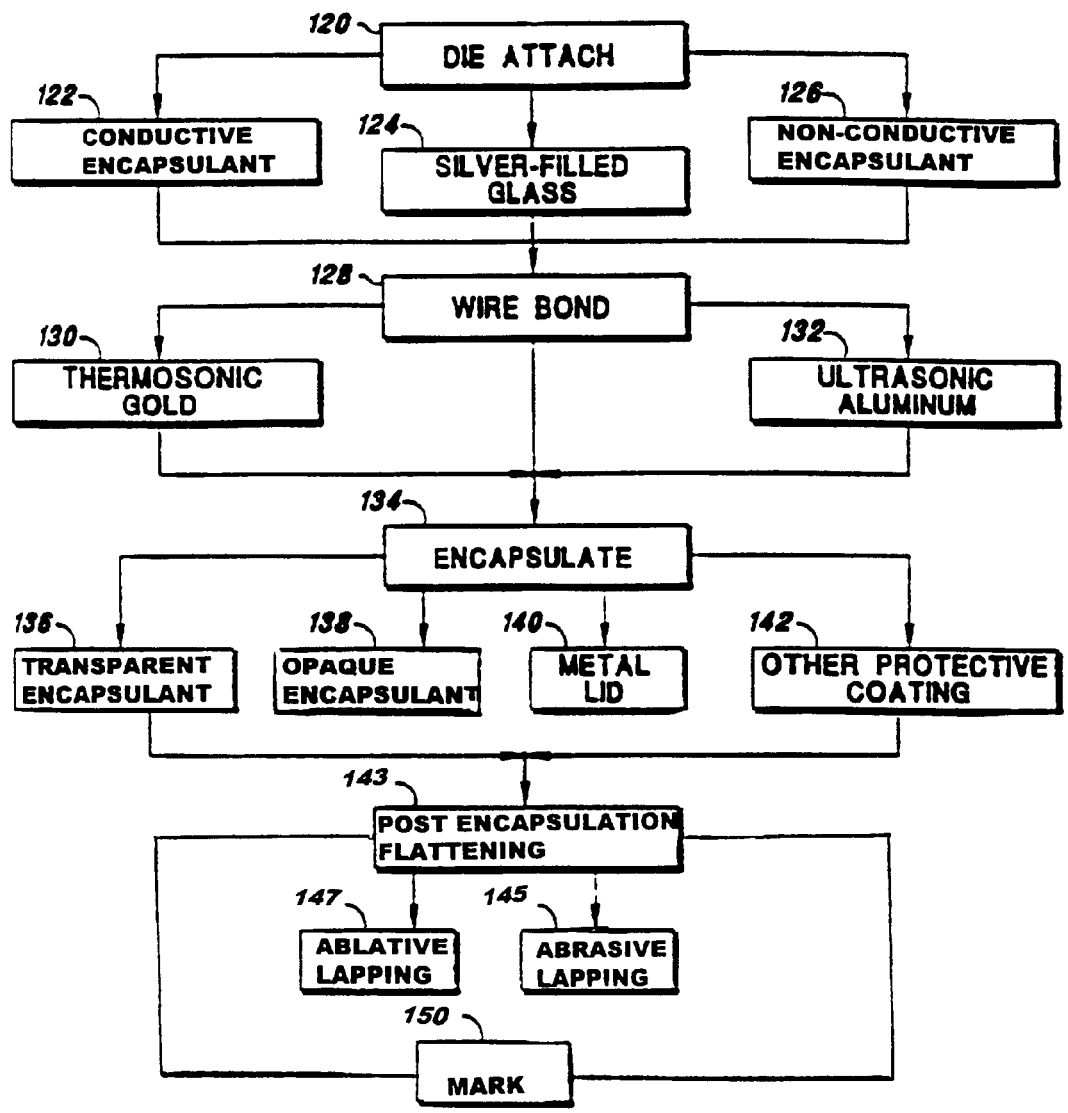
FIG. 7B illustrates process steps which may be used to reconstruct an IC package.

Block 120 of FIG. 7B shows a new die attachment step. The new die 162 may be installed using an encapsulant such as thermally cured conductive epoxy (Block 122), silver filled glass (Block 124), or non-conductive epoxy (Block 126), as desired by the application.

In the next step (Block 128), the input/output contact pads 80 on the die 62 are connected to the wire bond pads 72 on the lead frame 65. This may be accomplished using one of the known wire bonding methods, preferably ultrasonic aluminum (Block 103) or thermosonic gold (Block 130) wire bonding techniques.

During the encapsulating step (Block 134), the volume 70 is then filled with an encapsulant (e.g., filled with epoxy and cured, typically at 150–200° C. for 2–4 hours). As indicated in Blocks 136 and 138, the encapsulant may be transparent or opaque, respectively. Alternatively, a metal lid (Block 140) or any other protective cover or coatings (Block 142), such as for alpha particle protection or a moisture barrier, could be substituted for, or used in addition to, the encapsulant.

In some embodiments, the IC package may not include the vertical walls 76 shown in FIG. 4. For example, in very small packages (smaller than approx. 150 mils wide), there may not be enough room to include vertical walls with a sufficient thickness to hold the encapsulant.

For smaller IC packages without vertical walls, the encapsulation material can be removed over the entire top surface 184 of the package 160. The encapsulant 182 may then be placed over, or "blobbed", on top of the mounted die 162, the die attach pad 164, the wire bonds 166 and the wire bond pads 172. The encapsulant 182 can be easily formulated to have a viscosity such that the die 162 and wire bonds 166 are sufficiently protected. Because the encapsulant is non-conductive, even if the encapsulant runs over the edges of the package, the device will still be functional. While the package may not have precisely the same outline as a custom built device, the objectives of the packaging technique are still met. Further, after the "blob" on top and around the edges of the IC package has cured, it can be trimmed or cut using conventional techniques to give the package a form factor shape that at least approximates the original IC package form shape.

Figure 8:
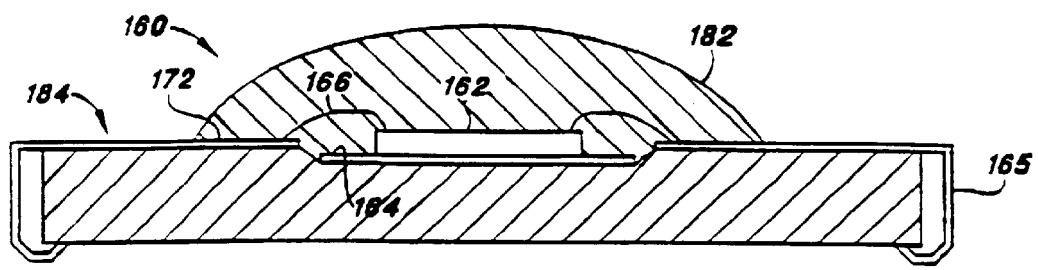
FIG. 8 depicts a reconstructed IC package where the encapsulant has a convex surface.

As can be seen from the discussions regarding FIGS. 6 and 8, the encapsulant may have a convex upper surface over the new die when no vertical walls are employed (FIG. 8) or when vertical walls are employed (e.g., vertical wall, 76 of FIG. 6), and too much encapsulant is applied. Meanwhile, encapsulant may have a concave upper surface over the new die when vertical walls are employed (e.g., vertical wall, 76 of FIG. 6), and too little encapsulant is applied.

Once the new die is encapsulated, reshaping of the encapsulant may be performed (See Block 143 of FIG. 7B). According to the present invention, this may be done by lapping. Specifically, lapping may be performed to flatten the upper surface of the encapsulant in order achieve a desired form factor for the reconstructed IC package. This desired form factor commonly approximates the original IC package form factor.

Figure 9:
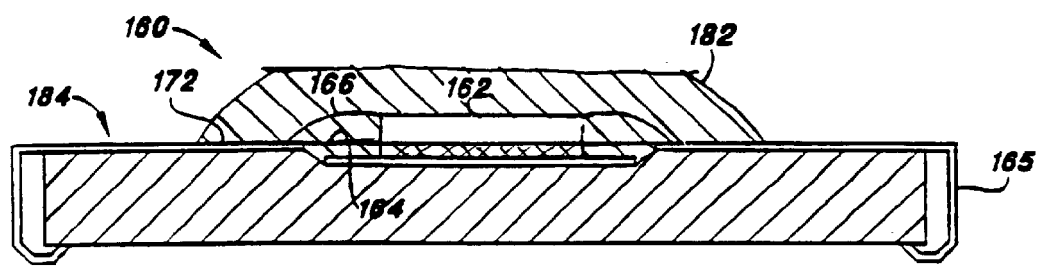
FIG. 9 depicts a reconstructed encapsulated chip package after lapping of a convex encapsulant material to form a flat top surface.

Lapping to reshape the encapsulant may be performed by any lapping technique. As illustrated in FIG. 7B, examples of lapping techniques that may be used include, but are not limited to abrasive forms of lapping (Block 145—e.g. chemical lapping, gas or fluid jet particulate lapping), and ablative forms of lapping (Block 147—e.g. chemical lapping, laser or other electromagnetic ablative lapping). FIG. 8 illustrates an IC package where the encapsulant has a convex shape and FIG. 9 illustrates the IC package where the encapsulant has a flat top, after lapping.

It is noted that other methods exist for forming the encapsulant in a predetermined shape. For example, a teflon mold may be placed over the encapsulant prior to curing to obtain a flat top. The use of a teflon mold, while effective for shaping the encapsulant, is more time consuming than lapping and is susceptible to operator error by either mis-aligning the mold (or molds for a parallel process) or placing too much encapsulant over the die. Alternatively, the IC package obtained in step 90 can have a cavity pre-molded therein so that the material removal and cleaning steps (92, 96, 100, 104 and 112) are unnecessary. Such cavitated packages can be lapped smooth for micro-polishing, or a non-lapping micro-polish may be employed, followed by cleaning as described above. The remaining steps of die attachment 120, wire bonding 128, and encapsulation 134 can then be performed, as described above.

Figure 10:
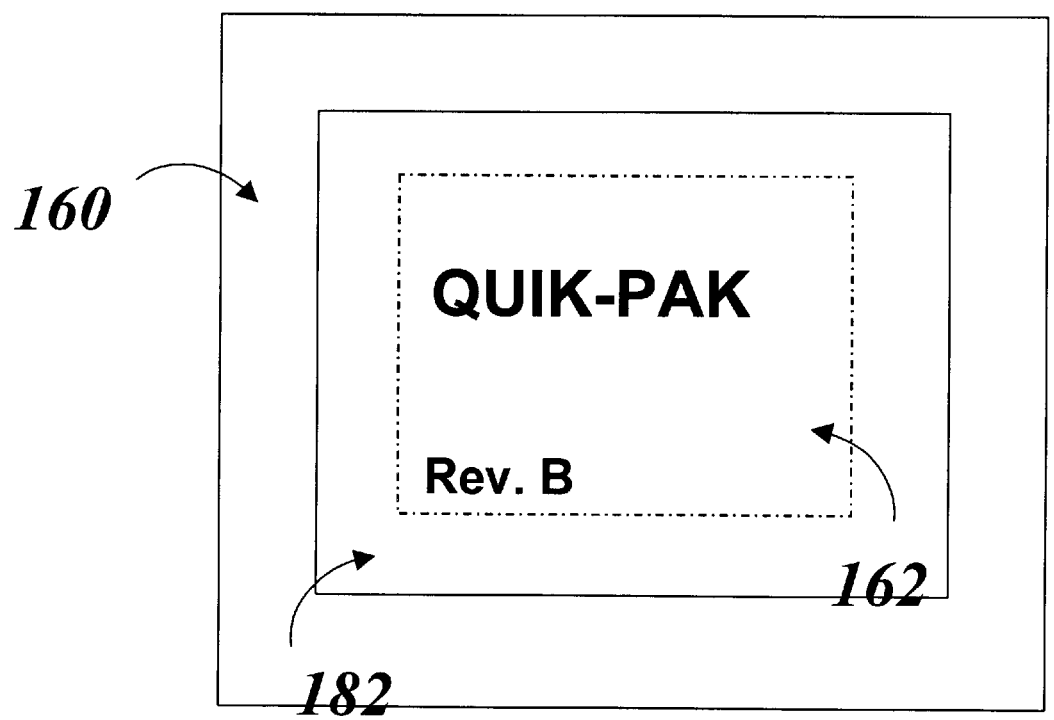
FIG. 10 depicts the reconstructed encapsulated chip package shown in FIG. 9 after it has been marked.

Once the encapsulant is formed and preferably reshaped, the encapsulant may be marked 150 (FIGS. 7B, 10) for identification, and/or advertisement. This may done by printing techniques, such as inkjet and laser printing, or by photolithography or other methods that employ a mask. Lapping is advantageous for marking the top because a top flattened by lapping can frequently be more readily labeled with uniform legible print or other markings. The uniformity and print quality that is obtainable by lapping the top of the reconstructed chip encapsulation package permits reliable optical character recognition by automated handling equipment, thereby facilitating automated handling. Printing or marking the top of the packages with a trademark or logo, or other advertising or mark is also facilitated by such lapping after encapsulation in the course of reconstructing the chip encapsulation package. Additionally, the resulting labeled package having a flattened top has a form and overall look and aesthetics of a production chip package rather than a makeshift part.

Advantageously, the reconstructed, labelled IC package that is producible according to the present invention can be made to be equivalent or superior to the initial IC package across all metrics, namely: functionally, dimensionally and cosmetically.

In the highly competitive semiconductor industry, decreasing the amount of time it takes to get a new product to market is economically advantageous. The present invention provides methods which dramatically reduce the time required to produce an electronic component to market by allowing the assembly and testing of prototype packaged units in less time than is currently possible. Furthermore, the invention allows the reconstructed IC packages that are formed to be identical to if not superior to the starting product. The invention thus provides, for example, a method that permits utilizing rejected electrical test devices, which normally are discarded, as the basic starting element to deconstruct the package by lapping, and mount a new integrated circuit die, and reconstruct a functional IC package. The form factor of the original package, or a compatible geometry, having a flattened top that facilitates marking the package is also provided by the lapping method of the instant invention.

While the invention has been described in the context of providing a fast turn-around for prototypes, it should be apparent to one skilled in the art that the present invention can provide an inexpensive method of packaging integrated circuit dies for production use as well. This may be of particular value to manufacturers with low volume per order that desire avoiding the tooling costs for an off-shore or equivalent conventional program, while providing the same appearance as the transfer molded package.

The foregoing description of various embodiments of the invention has been presented for purposes of illustration and description. It is not intended to limit the invention to the precise forms disclosed. Many modifications and equivalent arrangements will be apparent.

We claim:

1. A method for deconstructing an integrated circuit package comprising:
   taking an integrated circuit package comprising
      a lead frame having a plurality of wire bond pads for placing a die into electrical contact with the lead frame, and
      an encapsulant encapsulating the wire bond pads; and
   removing the encapsulation to expose the wire bond pads;
   wherein at least a portion of the encapsulant is removed by a lapping process for removing planar incremental layers of the encapsulant while maintaining a flat surface.

2. A method according to claim 1 wherein the integrated circuit package further comprises a die which is in electrical contact with the lead frame via the wire bond pads, the method further comprising removing the die from the integrated circuit package.

3. A method according to claim 2 wherein at least a portion of the die is removed from the integrated circuit package by lapping the die.

4. A method according to claim 1, further comprising cleaning the wire bond pads by lapping.

5. A method according to claim 1, further comprising polishing the wire bond pads by lapping.

6. A method according to claim 1, further comprising attaching a die to the exposed wire bond pads.

7. A method according to claim 6, further comprising cleaning the wire bond pads by lapping prior to attaching the die to the wire bond pads.

8. A method according to claim 6, further comprising polishing the wire bond pads by lapping prior to attaching the die to the wire bond pads.

9. A method according to claim 6, further comprising encapsulating the die and wire bond pads in an encapsulant.

10. A method according to claim 9, further comprising altering the shape of the encapsulant encapsulating the die and wire bond pads.

11. A method according to claim 9, further comprising altering the shape of the encapsulant encapsulating the die and wire bond pads by lapping the encapsulant.

12. A method according to claim 1, wherein lapping is performed by an abrasive or ablative lapping process.

13. A method according to claim 1, wherein lapping is performed by a mechanical, chemical, or electromagnetic lapping process.

14. The method of claim 1, wherein the lapping process comprises changing a speed of lapping after a certain amount of encapsulant is removed.

15. A method for deconstructing an integrated circuit package comprising:
taking an integrated circuit package comprising
a lead frame having a plurality of wire bond pads for placing a die into electrical contact with the lead frame, and
an encapsulant encapsulating the wire bond pads;
removing the encapsulant to expose the wire bond pads; and
cleaning the wire bond pads;
wherein at least one of removing the encapsulant and cleaning the wire bond pads is at least partially performed by a lapping process for removing planar incremental layers of the encapsulant while maintaining a flat surface.

16. A method for deconstructing an integrated circuit package comprising:
taking an integrated circuit package comprising
a lead frame having a plurality of wire bond pads for placing a die into electrical contact with the lead frame, and
an encapsulant encapsulating the wire bond pads;
removing the encapsulant to expose the wire bond pads;
cleaning the wire bond pads; and
polishing the wire bond pads;
wherein at least one of removing the encapsulant, cleaning the wire bond pads, and polishing the wire bond pads is at least partially performed by a lapping process for removing planar incremental layers of the encapsulant while maintaining a flat surface.

17. A method for deconstructing an integrated circuit package comprising:
taking an integrated circuit package comprising
a lead frame having a plurality of wire bond pads for placing a die into electrical contact with the lead frame, and
a die attached to the wire bond pads, and
an encapsulant encapsulating the wire bond pads;
removing the encapsulant to expose the wire bond pads;
removing the die; and
cleaning the wire bond pads;
wherein at least one of removing the encapsulant, removing the die, and cleaning the wire bond pads is at least partially performed by a lapping process for removing planar incremental layers of the encapsulant while maintaining a flat surface.

18. A method for deconstructing an integrated circuit package comprising:
taking an integrated circuit package comprising
a lead frame having a plurality of wire bond pads for placing a die into electrical contact with the lead frame,
a die attached to the wire bond pads, and
an encapsulant encapsulating the wire bond pads;
removing the encapsulant to expose the wire bond pads;
removing the die; and
cleaning the wire bond pads;
attaching a second die to the wire bond pads; and
reencapsulating the die;
wherein at least one of removing the encapsulant, removing the die, and cleaning the wire bond pads is at least partially performed by a lapping process for removing planar incremental layers of the encapsulant while maintaining a flat surface.

19. A method for deconstructing an integrated circuit package comprising:
taking an integrated circuit package comprising
a lead frame having a plurality of wire bond pads for placing a die into electrical contact with the lead frame;
a first die attached to the wire bond pads, and
an encapsulant encapsulating the wire bond pads;
removing the encapsulant to expose the wire bond pads;
removing the first die;
cleaning the wire bond pads;
polishing the wire bond pads;
attaching a second die to the wire bond pads; and
reencapsulating the die;
wherein at least one of removing the encapsulant, removing the die, cleaning the wire bond pads, and polishing the wire bond pads is at least partially performed by a lapping process for removing planar incremental layers of the encapsulant while maintaining a flat surface.

20. A method for deconstructing a plurality of integrated circuit packages comprising:
taking integrated circuit packages comprising
a lead frame having a plurality of wire bond pads for placing a die into electrical contact with the lead frame,
a first die attached to the wire bond pads, and
an encapsulant encapsulating the wire bond pads;
removing the encapsulants from the integrated circuit packages to expose the wire bond pads;
removing the first dies from the integrated circuit packages;
attaching second dies to the wire bond pads of the integrated circuit packages; and
reencapsulating the second dies;
wherein at least one of removing the encapsulants and removing the first dies is at least partially performed by a lapping two or more of the plurality of integrated circuit packages at the same time for removing planar incremental layers of the encapsulant while maintaining a flat surface.

21. A method for deconstructing a plurality of integrated circuit packages comprising:
taking integrated circuit packages comprising
a lead frame having a plurality of wire bond pads for placing a die into electrical contact with the lead frame,
a first die attached to the wire bond pads, and
an encapsulant encapsulating the wire bond pads;

removing the encapsulants from the integrated circuit packages to expose the wire bond pads;

removing the first dies from the integrated circuit packages;

cleaning the wire bond pads of the integrated circuit packages;

attaching second dies to the wire bond pads of the integrated circuit packages; and reencapsulating the second dies;

wherein at least one of removing the encapsulant, removing the die, and cleaning the wire bond pads is at least partially performed by lapping two or more of the plurality of integrated circuit packages at the same time, wherein the lapping removes planar incremental layers of the encapsulant while maintaining a flat surface.

22. The method of claim 21, wherein the integrated circuit packages have different package types.

23. A method for deconstructing a plurality of integrated circuit packages comprising:

taking integrated circuit packages comprising a lead frame having a plurality of wire bond pads for placing a die into electrical contact with the lead frame, a first die attached to the wire bond pads, and an encapsulant encapsulating the wire bond pads;

removing the encapsulants from the integrated circuit packages to expose the wire bond pads;

removing the first dies from the integrated circuit packages;

cleaning the wire bond pads of the integrated circuit packages;

polishing the wire bond pads of the integrated circuit packages;

attaching second dies to the wire bond pads of the integrated circuit packages; and reencapsulating the second dies;

wherein at least one of removing the encapsulant, removing the die, cleaning the wire bond pads, and polishing the wire bond pads is at least partially performed by lapping two or more of the plurality of integrated circuit packages at the same time, wherein the lapping removes planar incremental layers of the encapsulant while maintaining a flat surface.

24. The method of claim 23, wherein the integrated circuit packages have different package types.

* * * * *